United States Patent
Ting

(10) Patent No.: US 9,930,792 B1
(45) Date of Patent: Mar. 27, 2018

(54) ELECTRONIC DEVICE

(71) Applicants: Inventec (Pudong) Technology Corporation, Shanghai (CN); INVENTEC CORPORATION, Taipei (TW)

(72) Inventor: Kuo-Chi Ting, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/473,588

(22) Filed: Mar. 29, 2017

(30) Foreign Application Priority Data

Nov. 17, 2016 (CN) .......................... 2016 1 1032306

(51) Int. Cl.
| G06F 1/16 | (2006.01) |
| H05K 5/00 | (2006.01) |
| H05K 7/00 | (2006.01) |
| H04R 1/02 | (2006.01) |

(52) U.S. Cl.
CPC ........... H05K 5/0004 (2013.01); H04R 1/028 (2013.01)

(58) Field of Classification Search
CPC   G06F 1/18; G06F 1/183; G06F 1/187; H05K 5/0004; H04R 1/028
USPC .......................... 361/679.31–679.37, 724–727
See application file for complete search history.

(56) References Cited

U.S. PATENT DOCUMENTS

| 5,701,231 A * | 12/1997 | Do ........................... G06F 1/181 312/223.2 |
| 7,494,195 B2 * | 2/2009 | Han ....................... H02G 3/081 312/223.2 |
| 8,411,434 B2 * | 4/2013 | Goh ........................ G06F 1/181 361/679.04 |
| 9,557,785 B2 * | 1/2017 | Lin ........................... G06F 1/20 |
| 9,756,760 B2 * | 9/2017 | Dangy-Caye ...... H05K 7/20145 |
| 2003/0024765 A1 * | 2/2003 | Sugiura .................. G06F 1/1613 181/199 |
| 2006/0181845 A1 * | 8/2006 | Shah ....................... G11B 33/12 361/679.4 |
| 2011/0216497 A1 * | 9/2011 | Ting .......................... G06F 1/16 361/679.33 |
| 2011/0248612 A1 * | 10/2011 | Peng ....................... G06F 1/181 312/326 |

* cited by examiner

*Primary Examiner* — Anthony Haughton
(74) *Attorney, Agent, or Firm* — CKC & Partners Co., Ltd.

(57) ABSTRACT

An electronic device includes a housing, at least one cover, and a hard disk. The housing having an accommodating space, an inner surface, an outer surface, and at least one through hole communicating with the inner surface and the outer surface. The cover located at an outer side of the housing in which a chamber is formed between at least one portion of the cover and at least one portion of the outer surface, and the chamber is communicating with the accommodating space through the through hole. The hard disk disposed in the accommodating space.

9 Claims, 4 Drawing Sheets

ELECTRONIC DEVICE

CROSS-REFERENCE TO RELATED APPLICATION

This application claims priority to Chinese Application Serial Number 201611032306.0, filed Nov. 17 2016, which is herein incorporated by reference.

BACKGROUND

Field of invention

The present invention relates to an electronic device.

Description of Related Art

In general, an electronic device, such as a computer, is used for signal processing or data storage. In addition, in order to improve the storage capacity of the electronic device, an additional hard drive may be disposed in the electronic device. However, the hard disk generates vibration at a specific frequency during operation, thereby generating sound within a specific frequency range.

In other words, the electronic device may generate noise within a specific frequency to vibration generated by its internal component during operation. In addition, as the frequency of the vibration noise falls within a frequency range of human hearing, it will affect the user's sense of hearing, and the user's operational comfort on the electronic device. Therefore, how to reduce the volume of noise is issue that the industry has faced with.

SUMMARY

The present disclosure provides an electronic device with a resonant chamber.

The present disclosure provides an electronic device. The electronic device includes a housing at least one cover, and a hard disk. The housing has an accommodating space, an inner surface, an outer surface, and at least one through hole communicating with the inner surface and the outer surface. The cover is located at the outer side of the housing in which a chamber is formed between at least one portion of the cover and at least one portion of the outer surface, and the chamber is communicating with the accommodating space through the through hole. The hard disk is disposed in the accommodating space.

In some embodiments of the present disclosure, the chamber has a volume, and the through hole connected to the chamber has a cross-section and a depth, in which the cross-section is substantially parallel to the inner surface and has a cross-sectional area, and the depth is substantially equal to a distance between the inner surface and the outer surface. Sound generated by the hard disk during operation has a sound speed and at least one frequency, and a resonance frequency satisfies the following equation:

$f=fr=c/2n(A/VD)^{1/2}$; in which f represents the frequency of sound, fr represents the resonance frequency, c represents the sound speed, A represents the cross-sectional area of the through hole, V represents the volume of the chamber, and D represents the depth of the through hole.

In some embodiments of the present disclosure, the housing has the through holes; the chamber is communicating with the accommodating space through the through holes; the chamber has a volume; each of the through holes has a cross-section and a depth; the cross-section is substantially parallel to the inner surface and has a cross-section area; the depth is substantially equal to a distance between the inner surface and the outer surface; sound generated by the centrifugal fan module during operation has a sound speed and at least one frequency; and a resonance frequency satisfies the following equation:

$f=fr=c/2n(NA/VD)^{1/2}$; in which f represents the frequency of sound, fr represents the resonance frequency, c represents the sound speed, N represents a quantity of the through holes, A represents the cross-section area of the through hole, V represents the volume of the chamber, and D represents the depth of the through hole.

In some embodiments of the present disclosure, the outer surface of the housing has a bottom surface, and the cover at least covers the bottom surface.

In some embodiments of the present disclosure, the outer surface of the housing has a top surface, and at least one portion of the top surface is exposed from the cover.

In some embodiments of the present disclosure, the outer surface of the housing has a side surface, and the cover at least surrounds the side surface.

In some embodiments of the present disclosure, the electronic device further includes at least one spacer, in which the spacer divides the chamber into a plurality of sub-chambers, and each of the sub-chambers is communicating with the accommodating space through the at least one through hole.

In some embodiments of the present disclosure, at least two of the sub-chambers have different volumes.

In some embodiments of the present disclosure, the electronic device further includes a loudspeaker, and the cover has an opening, in which the loudspeaker is hermetically engaged with the opening.

In some embodiments of the present disclosure, the electronic device further includes supporting members, the supporting members being connected to a side of the cover facing away from the housing, in which when the electronic device stands on a reference plane by the supporting members, a gap is formed between the cover and the reference plane, and the loudspeaker is located between the chamber and the gap.

In the aforementioned configurations, the natural frequency of the chamber of the present disclosure can be designed by using the through hole of the housing and the cover located at the outside of the housing. When the natural frequency of the chamber is substantially the same as a frequency generated by the electronic device during operation, the chamber may have a resonance phenomenon. A friction between the chamber and an air column generated by the resonance phenomenon may consume sound energy, thereby enabling the electronic device to reduce the volume of sound and absorb the sound energy. Consequently, the electronic device of the embodiment may reduce the volume of sound with a broader bandwidth by the chamber.

Furthermore, because the cover covers at least one portion of outer surface of the housing, when the electronic device suffers an external force, the chamber formed between the housing and the partial outer surface may provide a buffer space to prevent the electronic components in the housing from being damaged by the external force, thereby enabling the housing to prevent the vibration caused by the external force. In addition, the chamber may act as a loudspeaker box, and the coverage of the cover against the outer surface of the housing can be changed according to the space required for the loudspeaker, and parameters of the through hole may be changed simultaneously to reduce the noise generated by the hard disk (or other components) in the housing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
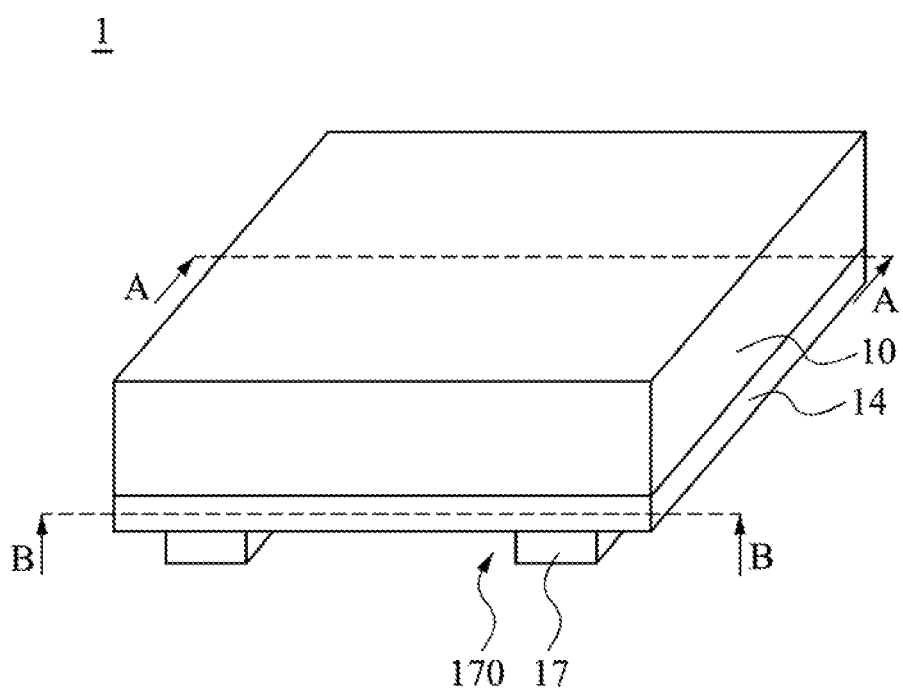
FIG. 1 is a perspective view of an electronic device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
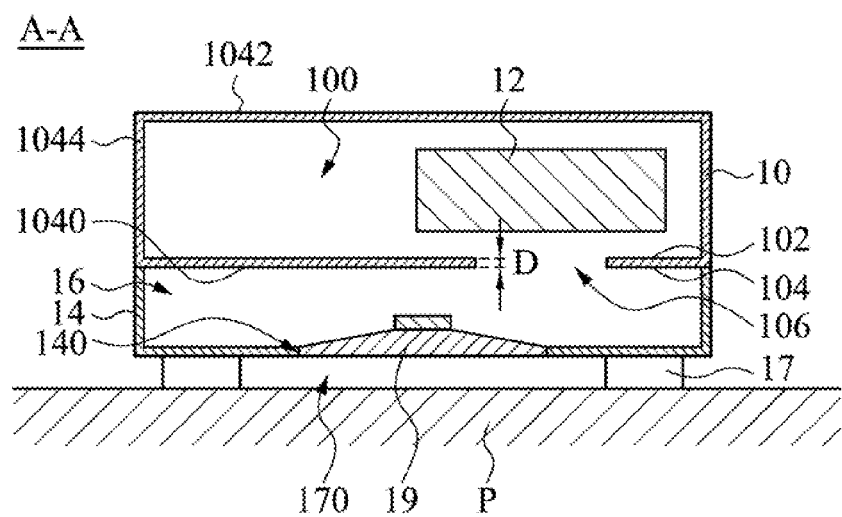
FIG. 2 is a cross-sectional view along line A-A in FIG. 1.

Reference is made to FIGS. 1 and 2. FIG. 1 is a perspective view of an electronic device 1 according to some embodiments of the present disclosure. FIG. 2 is a side cross-section view along line A-A in FIG. 1. As shown in FIGS. 1 and 2, in the embodiment, the electronic device 1 includes a housing 10, a cover 14, and a hard disk 12 (shown in FIG. 2). The structure and function of the components and their relationships are described in detail hereinafter.

In FIG. 2, the housing 10 has an accommodating space 100, an inner surface 102, an outer surface 104, and at least one through hole 106 (only one is depicted) communicating with the inner surface 102 and the outer surface 104. In other words, the thickness of the housing 10 is defined as a distance between the inner surface 102 and the outer surface 104. In detail, the outer surface 104 of the housing 10 further includes a bottom surface 1040, a top surface 1042, and a side surface 1044. The cover 14 is located at an outer side of the housing 10, and totally covers the bottom surface 1040 of the housing 10. Furthermore, a chamber 16 is formed between the cover 14 and the bottom surface 1040 of the outer surface 104, and is communicating with the accommodating space 100 through the through hole 106 of the housing 10. The hard disk 12 is disposed in the accommodating space 100. In some embodiments, the cover 14 may partially covers the bottom surface 1040 of the housing 10, and the chamber 16 is formed between the cover 14 and a portion of the bottom surface 1040 of the outer surface 104.

In general, frequencies generated by electronic components in the electronic device 1 during operation bring about a large amount of energy at plural frequency intervals. The electronic device 1 may reduce the volume of sound and absorb the energy of sound by using the Helmholtz resonance theory. When the natural frequency of the chamber 16 is substantially the same as a frequency generated by the electronic device 1 during operation, the chamber 16 may have a resonance phenomenon. A friction between the chamber 16 and an air column in the chamber 16 generated by the resonance phenomenon may consume the energy of the in the aforementioned frequency, thereby enabling the electronic device 1 to reduce the volume of sound and absorb the energy of sound. Consequently, the electronic device 1 of the embodiment may reduce the volume of sound with a broader bandwidth by the chamber 16.

Figure 3:
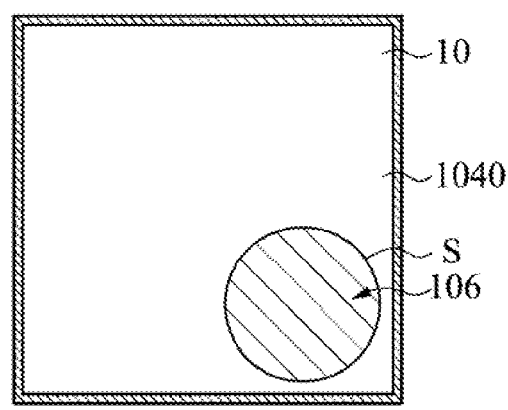
FIG. 3 is a cross-sectional view along line B-B in FIG. 1.

Reference is made to FIGS. 2 and 3. FIG. 3 is a cross cross-section view along line B-B in FIG. 1. For example, as shown in FIGS. 2 and 3, in the embodiment, a frequency f1 of the electronic device 1 at the time in operation may generate a larger volume of sound. The chamber 16 and the through hole 106 of the electronic device 1 and the frequency f1 may be designed to satisfy the Helmholtz formula as the following equation, thereby reducing the volume of sound with frequency f1.

$$f1 = fr1 = c/2n(A/VD)^{1/2}|$$

in which c represents the speed of sound, V represents the volume of the chamber 16, A represents the cross-section area of the cross-sections S of the through hole 106 and the cross-section S is substantially parallel to the inner surface 102 or the outer surface 104 of the hosing 10, D represents the depth of the through hole 106, and the depth D is substantially the same as a distance between the inner surface 102 and the outer surface 104, fr1 represents the resonance frequency of the chamber 16. In the embodiment, the shape of the through hole 106 is circular, but the present disclosure is not limited thereto. In some embodiments, the shape of the through hole 106 may be in any other suitable shapes, such as, rectangular and prismatic shape.

In the embodiment, a vertical projection of the hard disk 12 on the inner surface 102 of the housing 10 at least partially overlaps with the through hole 106 of the housing 10. In other words, the hard disk 12 is aligned with the through hole 106 of the housing 10. Furthermore, the hard disk 12 is the component closest to the through hole 106 in the housing 10 to prevent sound generated by the hard disk 12 from being blocked by other components in the electronic device 1, thereby enabling most noise generated by the hard disk 12 to bring about the resonance phenomenon with the chamber 16 and to reduce the volume of sound generated by the hard disk 12.

In FIG. 2, the cover has an opening 140. The electronic device 1 further includes a loudspeaker 19. The loudspeaker 19 is hermetically engaged with the opening 140. For example, sound generated by the loudspeaker 19 of the electronic device 1 may bring about resonance effect depending on the chamber 16 in a designed frequency, thereby enhancing the quality of sound generated by the loudspeaker 19. The designed frequency of sound generated by the loudspeaker 19 is different from the resonance frequency of the chamber. Therefore, the electronic device 1 may enhance the quality of sound generated by the loudspeaker 19, and reduce the interference of sound from the hard disk 12 to the loudspeaker 19 simultaneously by the chamber 16.

In the embodiment, the electronic device 1 further includes plural supporting members 17. The supporting members 17 are respectively connected to a side of the cover 14 facing away from the housing. When the electronic device 1 stands on a reference plane P by the supporting members 17, a gap 170 is formed between the cover 14 and the reference plane P. The loudspeaker 19 is located between the chamber 16 and the gap 170. In other words, the loudspeaker 19 and the supporting members 17 are located on the same side of the cover 14, thereby enabling sound generated by the loudspeaker 19 to be transmitted to an external environment by the gap 170.

Figure 4:
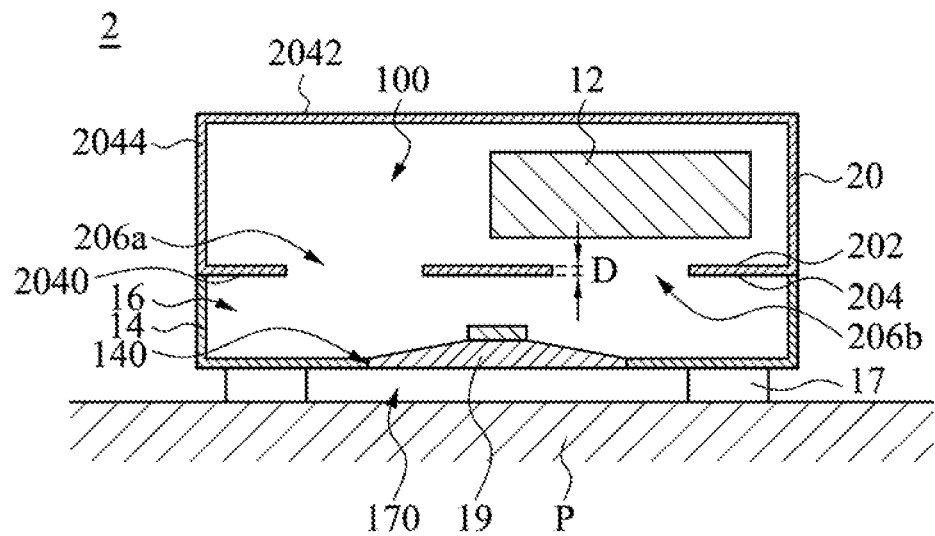
Fig. 4 is a cross-sectional view of an electronic device according to some embodiments of the present disclosure in which the housing has through holes.

Reference is made to FIG. 4. FIG. 4 is a cross-section view of an electronic device 2 according to some other embodiments of the present disclosure. As shown in FIG. 4, the structure and function of the components and their relationships are substantially the same as those of the electronic device 1 in FIGS. 1-3, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted.

It is noted that, the difference between the present embodiment and that in FIGS. 1-3 are in that the housing 20 has two through holes 206a and 206b, but the present disclosure is not limited thereto. In other embodiments, the number of the through holes may be plural, such as, three, four, or five or more through holes. For example, in the embodiment, frequencies generated by electronic components in the electronic device 2 at the time in operation bring about a large amount of energy in a frequency f2. The chamber 16 and the through hole 106 of the electronic device 1 and the frequency f2 may be designed to satisfy the Helmholtz formula as the following equation, thereby reducing the volume of sound with frequency f2.

$$f2 = fr2 c/2\pi (NA/VD)^{1/2};$$

in which c represents the speed of sound, N represents a quantity of the through holes, V represents the volume of the chamber 16, A represents the cross-section area of the cross-sections S of the through hole 206 or the through hole 206b and the cross-sections S is substantially parallel to the inner surface 202 or the outer surface 204 of the hosing 20, and the through hole 206a and the through hole 206b have the same cross-sectional area A in the embodiment, D represents the depth of the through hole 206a or the through hole 206b, and the depth D is substantially the same as a distance between the inner surface 202 and the outer surface 204, fr2 represents the resonance frequency of the chamber 16. In the embodiment, the shape of the through hole 206a and the through hole 206b are circular, but the present disclosure is not limited thereto. In some embodiments, the shape of the through hole 206a and the through hole 206b may be in any other suitable shapes, such as, rectangular and prismatic shapes.

As such compared to the embodiment in FIG. 2, the embodiment described herein can modify the resonant frequency of the chamber 16 by varying the number of through holes on the housing 20 without changing the volume of the chamber 16, the cross-sectional area A and the depth D of the through hole, thereby enabling the number of through-holes located in the housing 20 to be flexibly arranged by the user according to the practical requirements.

Figure 5:
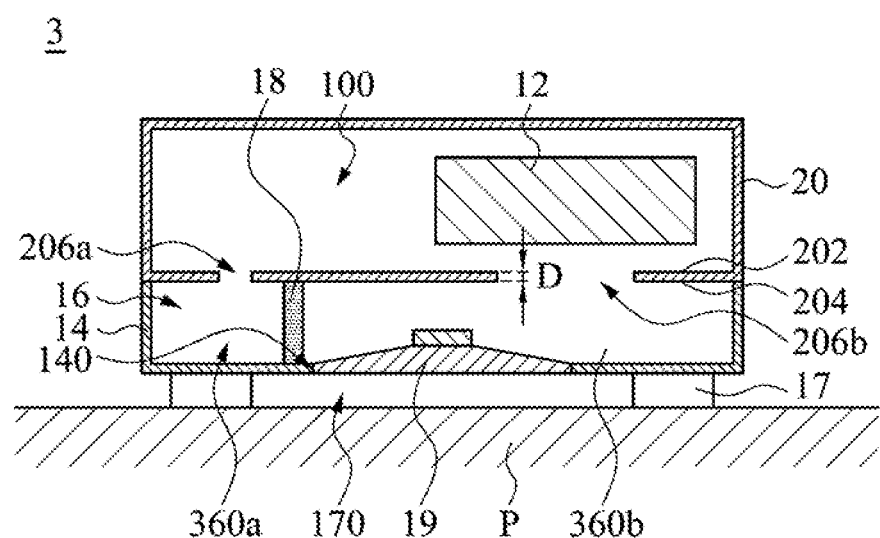
FIG. 5 is a side cross-sectional view of an electronic device according to some embodiments of the present disclosure in which the housing has through holes, and each of the sub-chambers is communicating with the accommodating space through the corresponding through hole.

Reference is made to FIG. 5. FIG. 5 is a cross-sectional view of an electronic device 3 according to some other embodiments of the present disclosure. As shown in FIG. 5, the structure and function of the components and their relationships are substantially the same as the electronic device 2 in FIG. 4, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted.

It is noted that, the difference between the present embodiment and that in FIG. 4 are in that the electronic device 3 further includes a spacer 18. The spacer 18 divides the chamber 16 into two sub-chambers 360a and 360b. The sub-chamber 360a is communicating with the accommodating space 100 of the housing 20 through the through hole 206a. The sub-chamber 360b is communicating with the accommodating space 100 of the housing 20 through the through hole 206b. Furthermore, in the embodiment, the volume of the sub-chamber 360a is different from the volume of the sub-chamber 360b, but the present disclosure is not limited thereto. In some embodiments, the volume of the sub-chamber 360a is substantially the same as the volume of the sub-chamber 360b.

In some embodiments, frequencies generated by the electronic device 3 at the time in operation have strong frequency responses at plural frequency intervals. In this case, the natural frequency of the sub-chamber 360a may be designed to be different from the natural frequency of the sub-chamber 360b in the present disclosure, and the natural frequencies are design to be substantially the same as the frequencies having the strong frequency responses, thereby reducing the volume of sound generated by the electronic device 3 effectively. Hence, the sub-chamber 360a and the sub-chamber 360b having the different natural frequencies can be used to reduce the volume of sound effectively.

For example, each of the frequency f3 and the frequency f4 of the electronic device 3 at the time in operation may generate a larger volume of sound. The chambers 360a and the through hole 206a of the electronic device 3, and the frequency f3 may be designed to satisfy the Helmholtz formula as the following equation, thereby reducing the volume of sound with frequency f3. Alternatively, the chambers 360b and the through hole 206b of the electronic device 3, and the frequency f4 may be designed to satisfy the Helmholtz formula as the following equation thereby reducing the volume of sound with frequency f4.

$f3=fr3=c/2n(A/V1D)^{1/2}$; and $f4=fr4=c/2n(A/V2D)^{1/2}$;

in which c represents the speed of sound V1 and V2 represent the volumes of the chambers 360a and 360b respectively, Furthermore, the volume V1 of the chamber 360a is different from the volume V2 of the chamber 360b, but the present disclosure is not limited thereto. In some embodiments, as long as the chambers 360a and 360b have parameters which satisfy the design requirements as previous described, they can be applied the present disclosure. In some embodiments, the cross-sectional area of the through hole 206a may be different from the cross-sectional area of the through hole 206b, but the present disclosure is not limited thereto.

In some embodiments, the number of spacers 18 may be more than one. Plural spacers 18 may divide the chamber 16 into two or more sub-chambers, thereby enabling the number of sub-chamber to be designed by the user according to actual requirements to reduce the volume of noise having plural strong frequency responses. Furthermore, each of the sub-chambers may be communicating with the accommodating space 100 of the housing 20 through plural through holes according to actual requirements.

In some embodiments, the electronic device 3 may further include plural covers. The covers may cover different portions of the bottom surface 2040 of the housing 20, and plural chambers are formed between the covers 14 and the different portions respectively. In other words, the covers are separated from each other. Furthermore, the aforementioned chambers are communicating with the accommodating space 100 through the through holes of the housing 20. In some other embodiments, the covers may cover the bottom surface 2040, the top surface 2042, and the side surface 2044 of the housing 20 respectively, and each of chambers is formed between the correspond cover and the corresponding surface on the housing 20. Furthermore, the aforementioned chambers are communicating with the accommodating space 100 through the through holes of the housing 20, but the present disclosure is not limited to the number and the configuration of the sub-chambers previously described. In some embodiments, the present disclosure can be applied to a configuration in which noise is effectively reduced by using sub-chambers having different natural frequencies.

Figure 6:
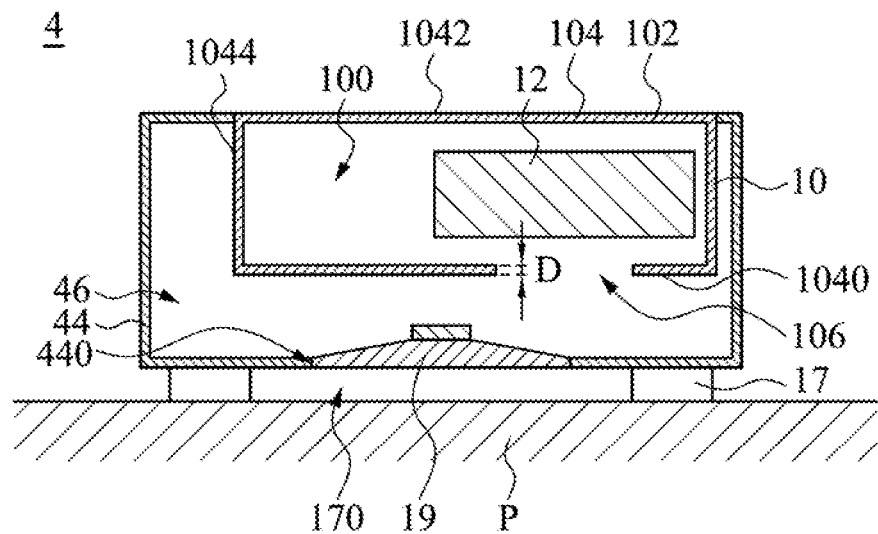
FIG. 6 is a side cross-sectional view of an electronic device according to some embodiments of the present disclosure in which a top surface of the housing is exposed from the cover.

Reference is made to FIG. 6. FIG. 6 is a side cross-sectional view of an electronic device 4 according with some embodiments of the present disclosure. As shown in FIG. 6, the structure and function of the components and their relationships are substantially the same as the electronic device 1 in FIG. 1, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted.

It is noted that, the difference between the present embodiment and that in FIG. 1 are in that the top surface 1042 is exposed from the cover 44. In other words, the cover 44 totally covers the bottom surface 1040 and the side surface 1044 of the housing 10, but the present disclosure is not limited to. In some embodiments, the cover 44 totally may cover the bottom surface 1040 and the side surface 1044 of the housing 10, and further may cover the top surface 1042 of the housing 10. In other words, the cover 44 may totally cover the outer surface 104 of the housing 10. That is, the housing 10 may be located in the cover 44.

As such, the embodiment described herein can modify the resonant frequency of the chamber 16 by varying the coverage of the cover 44 against the outer surface 104 of the housing 10 in the case which parameters of the through hole 106 are fixed, thereby reducing the volume of noise generated by the electronic device 4. Furthermore, because the cover 44 covers at least one portion of outer surface 104 of the housing 10, when the electronic device 4 suffers an external force, the chamber 46 formed between the housing 44 and the partial outer surface 104 may provide a buffer space to prevent the electronic elements in the housing 10 from being damaged by the external force. In other words, when the electronic device 4 suffers an external force, the cover 44 may deform due to the external force and absorb the energy provided by the external force to prevent the energy from transferring to the housing 10, thereby enabling the housing 10 to prevent from the vibration caused by the external force. Furthermore, the chamber 46 may act as a loudspeaker box, and the coverage of the cover 44 against the outer surface 104 of the housing 10 can be changed according to the space required for the loudspeaker 19, and parameters of the through hole 16 may be changed simultaneously to reduce the noise generated by the hard disk 12 (or other elements) in the housing 10.

Furthermore, the cover 44 has an opening 440. The opening 440 is located at a side of the cover 44 near the reference plane P. In other embodiments, the opening 440 may located at a side of the cover 44 opposite to the side surface 1040 of the housing 10. The loudspeaker 19 is hermetically engaged to the opening 440 of the cover 44. Sound generated by the loudspeaker 19 of the electronic device 4 may bring about resonance effect depend on the chamber 46 in a designed frequency, thereby enhancing the quality of sound generated by the loudspeaker 19.

Figure 7:
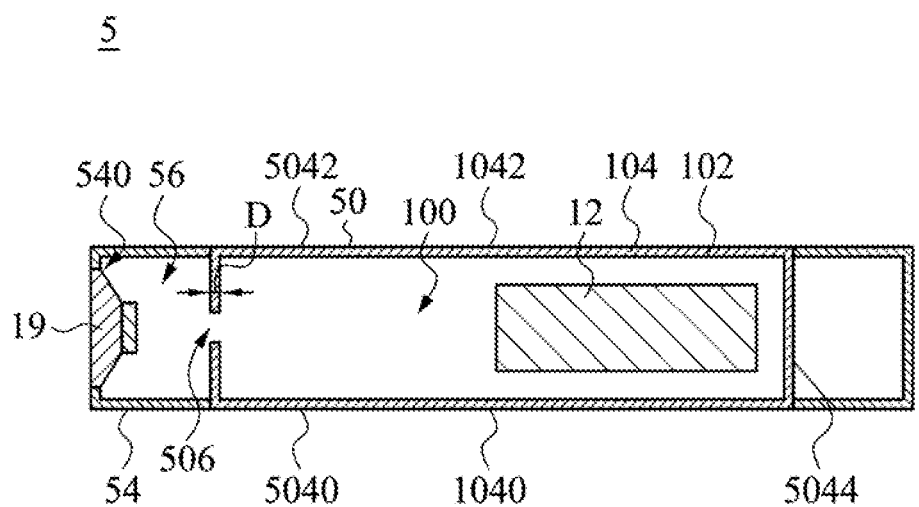
FIG. 7 is a side cross-section view of an electronic device according to some embodiments of the present disclosure in which the cover surrounds a side surface of the housing.

Reference is made to FIG. 7. FIG. 7 is a side cross-section view of an electronic device 5 according with some embodiments of the present disclosure. As shown in FIG. 5, the structure and function of the elements and the relationship therebetween are substantially the same as the electronic device 1 in FIG. 1, and the related detailed descriptions may refer to the foregoing paragraphs, and are not discussed again herein. Hence, the present disclosure may repeat reference numerals and/or letters in the examples as the previous embodiment. This repetition is for the purpose of simplicity and clarity and represents the same or similar elements, and the description of the same technical contents is omitted.

It is noted that, the difference between the present embodiment and that in FIG. 1 are in that a cover 54 surrounds the side surface 5044 of the housing 50, a chamber 56 is formed between the cover 54 and the side surface 5044, and chamber 56 is communicating with the accommodating space 100 through the through hole 506 of the housing 50. However, in other embodiment, the cover 54 may surround the side surface 5044 of the housing 50, and further may surround a peripheral portion of the bottom surface 5040 and another peripheral portion of the top surface 5042 of the covering 50.

Furthermore, the cover 54 has an opening 540. The opening 540 is located at a side of the cover 54 facing away from the housing 50. The loudspeaker 19 is hermetically engaged to the opening 540. Sound generated by the loudspeaker 19 of the electronic device 5 may bring about resonance effect depend on the chamber 56 in a designed frequency, thereby enhancing the quality of sound generated by the loudspeaker 19.

According to the foregoing recitations of the embodiments of the disclosure, it can be seen that the natural frequency of the chamber of the present disclosure can be designed by the through hole of the housing and the cover located at the outside of the housing. When the natural frequency of the chamber 16 is substantially the same as a frequency generated by the electronic device 1 at the time in operation, the chamber 16 may have a resonance phenomenon. A friction between an air column in the chamber and the chamber generated by the resonance phenomenon may consume the energy of the in the aforementioned frequency, thereby enabling the electronic device to reduce the volume of sound and absorb the energy of sound.

Consequently, the electronic device of the embodiment may reduce the volume of sound having a broader bandwidth by the chamber.

Furthermore, because the cover covers at least one portion of outer surface of the housing, when the electronic device suffers an external force, the chamber formed between the housing and the partial outer surface may provide a buffer space to prevent the electronic elements in the housing from being damaged by the external force, thereby enabling the housing to prevent from the vibration caused by the external force. In addition, the chamber may act as a loudspeaker box, and the coverage of the cover against the outer surface of the housing can be changed according to the space required for the loudspeaker, and parameters of the through hole may be changed simultaneously to reduce the noise generated by the hard disk (or other elements) in the housing.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
a housing having an accommodating space, an inner surface, an outer surface, and at least one through hole communicating with the inner surface and the outer surface and has a cross-section and a depth, wherein the cross-section is substantially parallel to the inner surface and has a cross-sectional area, and the depth is substantially equal to a distance between the inner surface and the outer surface;
at least one cover located at an outer side of the housing, wherein a chamber is formed between at least one portion of the cover and at least one portion of the outer surface, and the chamber is communicating with the accommodating space through the through hole and has a volume; and
a hard disk disposed in the accommodating space, wherein sound generated by the hard disk during operation has a sound speed and at least one frequency, and wherein a resonance frequency satisfies the following equation:

$$f=fr=c/2n(A/VD)^{1/2};$$

wherein f represents a frequency of sound, fr represents a resonance frequency, c represents a sound speed, A represents a cross-sectional area of the through hole, V represents a volume of the chamber, and D represents the depth of the through hole.

2. The electronic device of claim 1, wherein the outer surface of the housing has a bottom surface, and the cover at least covers the bottom surface.

3. The electronic device of claim 1, wherein the outer surface of the housing has a top surface, and at least one portion of the top surface is exposed from the cover.

4. The electronic device of claim 1, wherein the outer surface of the housing has a side surface, and the cover at least surrounds the side surface.

5. The electronic device of claim 1, further comprising at least one spacer, the spacer dividing the chamber into a plurality of sub-chambers, and each of the sub-chambers being communicating with the accommodating space through the at least one through hole.

6. The electronic device of claim 5, wherein at least two of the sub-chambers have different volumes.

7. The electronic device of claim 1, further comprising a loudspeaker, the cover having an opening, wherein the loudspeaker is hermetically engaged to the opening.

8. The electronic device of claim 7, further comprising a plurality of supporting members, the supporting members being connected to a side of the cover facing away from the housing, wherein when the electronic device stands on a reference plane by the supporting members, and a gap is formed between the cover and the reference plane, and the loudspeaker is located between the chamber and the gap.

9. An electronic device, comprising:
a housing having an accommodating space, an inner surface, an outer surface, and a plurality of through holes communicating with the inner surface and the outer surface and each of the through holes has a cross-section and a depth, wherein the cross-section is substantially parallel to the inner surface and has a cross-sectional area, and the depth is substantially equal to a distance between the inner surface and the outer surface;
at least one cover located at an outer side of the housing, wherein a chamber is formed between at least one portion of the cover and at least one portion of the outer surface, and the chamber is communicating with the accommodating space through the through holes and has a volume; and
a hard disk disposed in the accommodating space, wherein sound generated by the hard disk during operation has a sound speed and at least one frequency, and wherein a resonance frequency satisfies the following equation:

$$f=fr=c/2n(NA/VD)^{1/2};$$

wherein f represents a frequency of sound, fr represents a resonance frequency, c represents a sound speed, N represents a quantity of the through holes, A represents a cross-section area of the through hole, V represents a volume of the chamber, and D represents the depth of the through hole.

* * * * *